United States Patent [19]
Ueno

[11] Patent Number: 5,384,270
[45] Date of Patent: Jan. 24, 1995

[54] METHOD OF PRODUCING SILICON CARBIDE MOSFET
[75] Inventor: Katsunori Ueno, Kawasaki, Japan
[73] Assignee: Fuji Electric Co., Ltd., Kanagawa, Japan
[21] Appl. No.: 149,824
[22] Filed: Nov. 10, 1993
[30] Foreign Application Priority Data Nov. 12, 1992 [JP] Japan ................................. 4-301439
[51] Int. Cl.$^6$ ......................................... H01L 21/265
[52] U.S. Cl. ..................................... 437/40; 437/41; 437/100; 437/913; 437/984; 148/DIG. 148; 257/77
[58] Field of Search ...................... 437/40, 41, 100, 47, 437/913, 984; 148/DIG. 148; 257/77

[56] References Cited

U.S. PATENT DOCUMENTS

| | | | |
|---|---|---|---|
| 5,323,0040 | 6/1994 | Baliga | 257/77 |
| 4,757,028 | 7/1988 | Kondoh et al. | 437/40 |
| 4,762,806 | 8/1988 | Suzuki et al. | 437/913 |
| 4,994,413 | 2/1991 | Eshita | 437/41 |
| 5,087,576 | 2/1992 | Edmond et al. | 437/100 |
| 5,124,779 | 6/1992 | Furukawa et al. | 257/77 |
| 5,184,199 | 2/1993 | Fujii et al. | 257/77 |
| 5,216,264 | 6/1993 | Fujii et al. | 257/77 |
| 5,233,215 | 8/1993 | Baliga | 257/77 |
| 5,264,713 | 11/1993 | Palmour | 437/100 |
| 5,322,802 | 6/1994 | Baliga et al. | 148/DIG. 148 |

FOREIGN PATENT DOCUMENTS

| | | | |
|---|---|---|---|
| 63-47983 | 2/1988 | Japan . | |
| 0213141 | 8/1990 | Japan | 437/100 |
| 2-291123 | 11/1990 | Japan . | |
| 4-29368 | 1/1992 | Japan . | |
| 0129327 | 5/1993 | Japan | 437/40 |
| 0004056 | 5/1989 | WIPO | 257/77 |

OTHER PUBLICATIONS

Shibahara et al., "Fabrication of Inversion-Type n-channel MOSFET's using Cubic-SiC on Si(100)", IEEE Electron Device Lett. vol. EDL-7 No. 12 Dec. 1986; pp. 692-693.
Davis; "Epitaxial Growth and Doping of And Device Development in Monocrystalline B-SiC Semiconductor Thin Films", Thin Solid Films, 181 (1989); pp. 1-15.
"Power Semiconductor Device Figure of Merit for High-Frequency Applications", B. J. Baliga, IEEE Electron Device Letters, 10(10):455-457 (1989).
"Optimum Semiconductors for High-Power Electronics", K. Shenai et al., IEEE Transactions on Electron Devices, 36(9):1811-1823 (1989).
"Thin Film Deposition and Microelectronic and Optoelectronic Device Fabrication and Characterization in Monocrystalline Alpha and Beta Silicon Carbide", R. F. Davis et al., Proceedings of the IEEE, 79(5):677-701 (1991).
"Ion Implantation Effects of Nitrogen, Boron, and Aluminum in Hexagonal Silicon Carbide", A. Addamiano et al., Journal of the Electrochemical Society:Solid State Science and Technology, 119(10):1355-1361 (1972).
"Investigation of the Electroluminescence of α-Sic Crystals Implantation-Doped With Boron, Aluminum and Gallium" V. M. Gusev et al., Sov. Phys. Semicond., 9(7):820-822 (1976).
"Characterization of device parameters in high-temperature metal-oxide-semiconductor field-effect transistors in β-SiC thin films", Palmour et al., J. Appl. Phys., vol. 64, No. 4, pp. 2168-2177, Aug. 1988.

Primary Examiner—Brian E. Hearn
Assistant Examiner—Trung Dang
Attorney, Agent, or Firm—Finnegan, Henderson, Farabow, Garrett & Dunner

[57] ABSTRACT

In a method of producing a silicon carbide MOSFET, a predetermined conductivity type region having a predetermined depth is formed in an SiC layer through ion injection and heat treatment activation by utilizing the fact that the range of impurity ions at the time of ion injection can be controlled by an acceleration voltage to thereby avoid a disadvantage of an SiC crystal in which diffusion of impurity is hardly generated. For example, ions are injected into an n-type SiC semiconductor layer by using, as a mask, a gate electrode having an inclined surface at its end surface to thereby form a p-type region having a curved surface in an interface. Alternatively, a part of a p-type SiC epitaxial layer on an n-type SiC substrate is left as a p-type base layer, and an n-type region is formed through ion injection and connected to a substrate portion under the n-type region to thereby form an n-type base region.

4 Claims, 3 Drawing Sheets

METHOD OF PRODUCING SILICON CARBIDE MOSFET

BACKGROUND OF THE INVENTION

The present invention relates to a method of producing a silicon carbide MOSFETs by using silicon carbide (SIC) as its main material.

Conventionally, a silicon single crystal has been used as the material for a power semiconductor device for controlling a large current and a high withstanding voltage. There are various kinds of power semiconductor devices and they are selectively used in accordance with a use in the existing circumstances. For example, in the case of a bipolar transistor, high speed switching cannot be performed although it is large in current density, and therefore it has a limit in use at several kHz. A power MOSFET, on the contrary, can be used at a high speed up to several MHz although it cannot treat a large current. Since power devices having large current and high speed properties have been earnestly required in a market, however, efforts have been given on the improvement of bipolar transistors, power MOSFETs, and so on, and the development has advanced near a limit in view of materials. Material examination has been performed in view of power semiconductor devices has been performed and it is considered that GaAs, diamond, and SiC have a large advantage as materials as reported by Beliga in IEEE Electron Device Letters, Vol. 10 (1989), p. 455 and by Shenai et al. in IEEE Transactions on Electron Devices, Vol. 36 (1989), p. 181. In the case of GaAs, however, it is difficult to apply GaAs to a gate drive device represented by an MOS because such a high-quality insulating film as silicon cannot be obtained by GaAs although GaAs has been applied to Schottky diodes. Further in the case of diamond, it is impossible to artificially produce a large diameter single crystal from diamond, it is difficult to control the conductivity type, and it is difficult to use diamond in the form of a semiconductor. In the case of SiC, on the other hand, a single crystal can be formed and wafers having a diameter of 1 inch are available on the market, the diameter thereof being shifted to 2 inches. Further, SiC is more advantageous than the other materials in the fact that the conductivity type can be controlled and $SiO_2$ acting as an insulating film can be grown by thermal oxidation similarly to the case of silicon. In these points of view, trial manufacture of transistors such as MOSFETs and so on have been reported and the MOS operation has been confirmed by Palmour et al. in J. Appl. Phys. Vol. 64 (1988), p. 2168 and by Davis et al. in Proceedings of the IEEE, Vol. 79 (1991), p. 677. All the MOSFETs which have been generally used are of the type in which a current is made to flow laterally, and, therefore, they cannot be applied as they are to power semiconductor devices requiring a large current. A vertical power MOSFET using silicon has a configuration in which, as shown in FIG. 2, a p-type base region 22 is formed in a surface layer of an n-type base layer 21 and a gate electrode 26 is formed on the surface of the n-type base layer 21 through a gate insulating film 25 so as to form an n-type channel in a portion 24 between a source region 23 and an exposed portion of the n-type base layer 21, so that a current is made to flow from a source electrode 27 commonly contacting with the $n^+$-type source region 23 and the p-type base region 22 into a drain electrode 29 contacting with an $n^+$-type buffer layer 28 at the rear surface side of the n-type layer 21. Thus, it is deviced that a current is made to flow vertically by use of the whole chip surface. In this MOSFET, the n-type channel is formed in the surface region 24 by application of a voltage to the gate electrode 26, and the source electrode 27 and the drain electrode 29 are conducted to each other. In this MOSFET, it is possible to inhibit a high voltage by increasing the thickness of the n-type base layer 21 which is one of junction layers between the p-type base region 22 supplied with a reverse voltage and the n-type base layer 21.

There is a significant problem in application of such a configuration as it is as shown in FIG. 2 to an SiC device. SiC is advantageous in that it has a stable chemical property and the strength of combination between crystals is stronger than that of Si, and, therefore, adversely, diffusion of impurity is hardly generated. That is, it is very difficult in the case of SiC to generate impurity diffusion of donors and acceptors, which is a fundamental technique with respect to Si, and the fact that diffusion is hardly found even at 1700° C. has been reported by Addamiano et al. in Journal of the Electrochemical Society, Vol. 119 (1972), p. 1355 and by Gusev et al. in Sov. Phys. Semicond., Vol. 9 (1976), p. 820.

In the case of producing the Si power MOSFET of FIG. 2, the p-type base region 22 is formed in such a manner that impurity ions are injected by using the gate electrode 26 as a mask and diffused through high-temperature heat treatment. This technique called self alignment double diffusion is important in formation of a high-quality device. But, this technique cannot be applied as it is to SiC devices because of the foregoing reasons.

SUMMARY OF THE INVENTION

It is therefore an object of the present invention to solve the foregoing problems in the prior art, and to provide a method of producing an SiC MOSFET without depending on impurity diffusion.

In order to attain the above object, according to an aspect of the present invention, the method of producing a silicon carbide MOSFET in which a second conductivity type base region is selectively formed in a surface layer of a first conductivity type semiconductor layer of silicon carbide, a first conductivity type base region is selectively formed in a surface layer of the second conductivity type base region, and a gate electrode is provided, through an insulating film, on a surface of the second conductivity type base region between the first conductivity type base region and an exposed portion of the first conductivity type semiconductor layer, comprises the steps of: forming the gate electrode having an inclined surface at its end portion; injecting impurity ions into a region of the first conductivity type semiconductor layer which is not covered with the gate electrode and into a region just under the inclined surface; and then forming the second conductivity type base region through heat treatment. According to another aspect of the present invention, the method of producing such a silicon carbide MOSFET as mentioned above comprises the steps of: epitaxially growing a second conductivity type silicon carbide layer on a first conductivity type silicon carbide substrate; injecting impurity ions into the second conductivity type silicon carbide layer while leaving a portion of the second conductivity type base region; and forming a first conductivity type layer through heat treatment so as to extend to a portion of the first conductivity type substrate. In either method, preferably, impurity ions are selectively injected from a surface of the second conductivity type base region, and the first conductivity type base region is formed through heat treatment.

In either method, preferably, the gate electrode is used as at least a part of a mask at the time of injection of impurity ions.

In the ion injection in which ionized impurity is accelerated with high energy and injected into a semiconductor substrate, the depth of implantation can be controlled by the acceleration energy. Therefore, a predetermined conductivity type region having a predetermined depth can be formed in a substrate without utilizing diffusion. A self alignment technique using a gate electrode as a mask at the time of injection can be applied to make it possible to realize high performance. Further, by forming an inclined surface at an end portion of a gate electrode, the surface of the region formed by ion injection is curved so as to prevent electric field concentration to thereby make the withstanding voltage high. Alternatively, the structure of a vertical MOSFET can be formed, by using both an epitaxial growth technique and an ion injection technique, through a process in which a part of an epitaxial layer is left as a second conductivity type base region and the ion-injected region is made to be the surface layer of a first conductivity type semiconductor layer.

DETAILED DESCRIPTION OF THE PREFERRED EMBODIMENTS

Referring to the accompanying drawings, embodiments of the present invention will be described under.

Figure 1A:
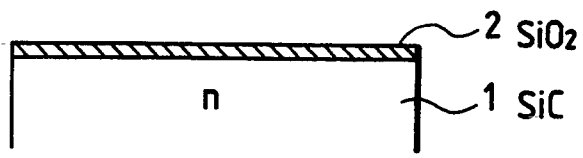
FIGS. 1(a) through 1(g) are cross sections showing, in order, the steps of producing an MOS portion of an SiC MOSFET according to an embodiment of the present invention.
Figure 1B:
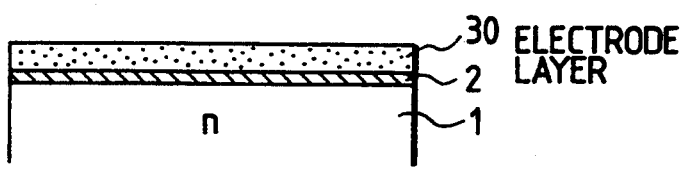
Figure 1C:
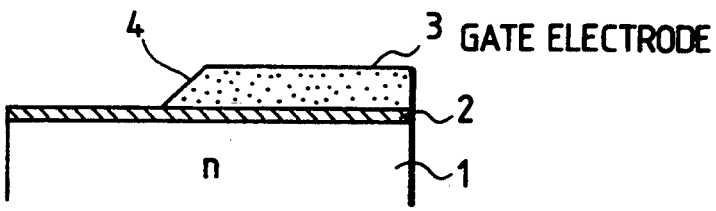
Figure 1D:
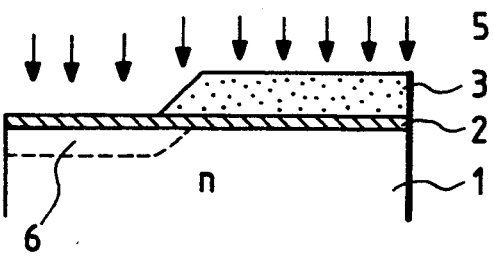
Figure 1E:
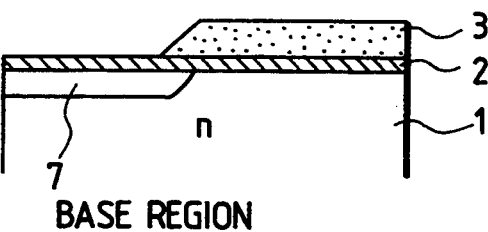
Figure 1F:
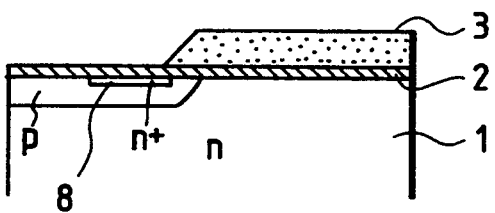
Figure 1G:
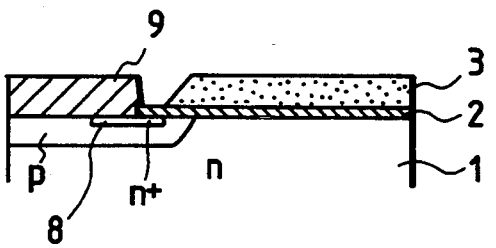
Figure 2:
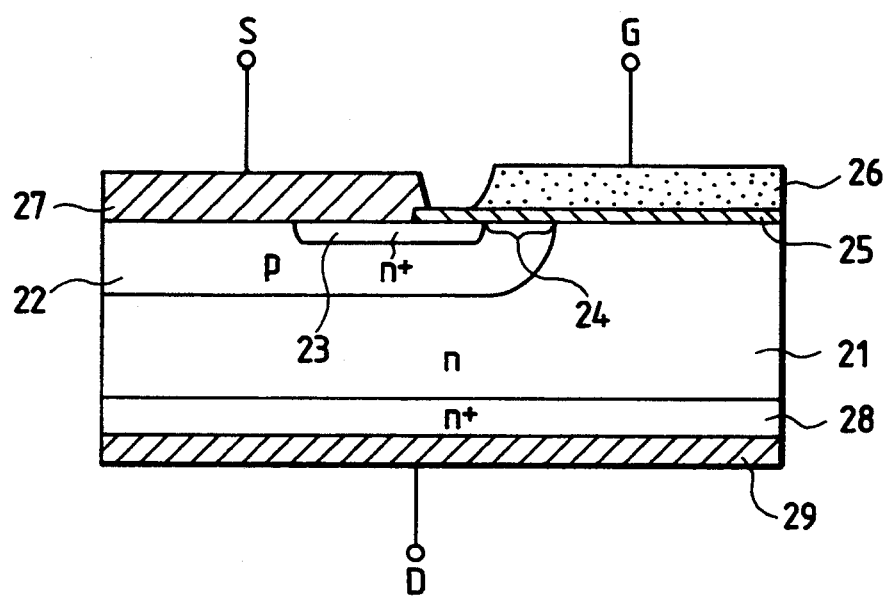
FIG. 2 is a cross section showing an SiC power MOSFET.
Figure 3A:
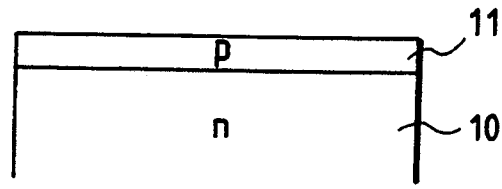
FIGS. 3(a) through 3(h) are cross sections showing, in order, steps of producing an MOS portion of an SiC MOSFET according to another embodiment of the present invention.
Figure 3B:
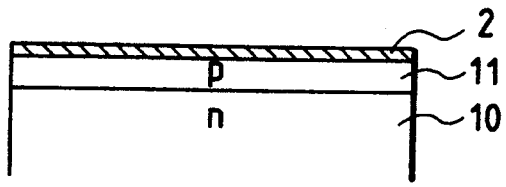
Figure 3C:
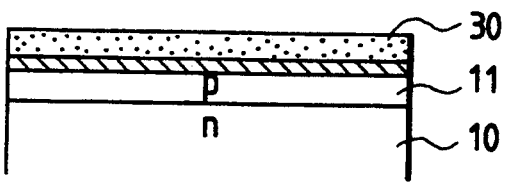
Figure 3D:
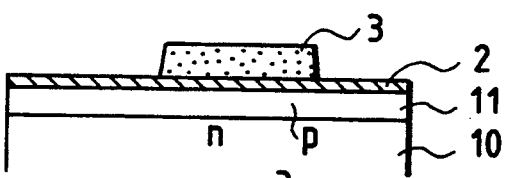
Figure 3E:
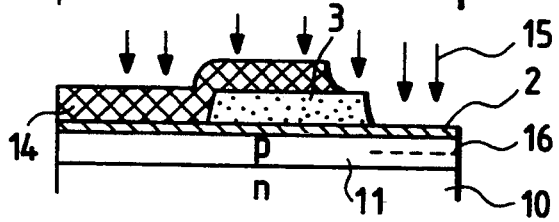
Figure 3F:
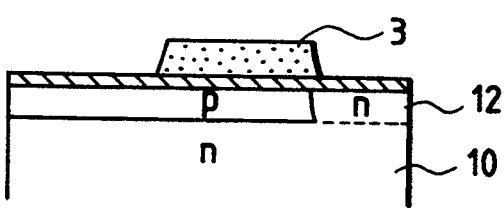
Figure 3G:
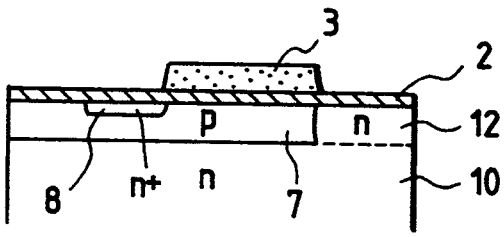
Figure 3H:
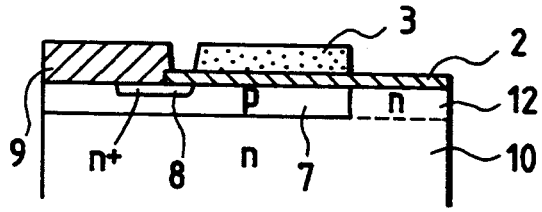

In an embodiment shown in FIGS. 1(a) through 1(g), first, an $SiO_2$ film 2 is formed on the surface of an n-type SiC substrate 1 by thermal oxidation (FIG. 1(a)). As the substrate 1, it is suitable to use a substrate having a structure in which an n-type epitaxial layer is grown on an n+ substrate which forms an ohmic contact with a drain electrode (not shown). Then, an electrode layer 30 of poly-crystal silicon or metal is formed on the $SiO_2$ film 2 through sputtering or through a CVD method (FIG. 1(b)), and a gate electrode 3 is formed by patterning through etching (FIG. 1(c)). At this time, a surface 4 inclined relative to the surface of the substrate 1 at an angle of 60°, or less is formed at an end portion of the gate electrode 3. The inclination angle of the inclined surface 4 may be adjusted by a method in which isotropic etching is performed or by a method in which etching is performed after giving damage in the surface of the electrode layer 30 by injection of Ar or As ions. Next, a p-type impurity such as Al, B, or the like is injected into a region 6 by using the gate electrode 3 as a mask (FIG. 1(d)). At this time, the impurity is led also into a region of the substrate 1 just under the inclined surface 4 in accordance with the thickness of the gate electrode 3 under the inclined surface 4. Thereafter, the injected impurity is activated by heat treatment of about 1700° C. so as to form a p-type base region 7 (FIG. 1(e)). Next, ion injection of an n-type impurity of N, As, P, or the like is performed from the surface of the p-type base region 7 by using the gate electrode 3 and a resist film (not shown) as masks and then heat treatment is performed to thereby form an n+ source region 8 in the same manner as in the foregoing step (FIG. 1(f)). Further, the $SiO_2$ film 3 is opened and a source electrode 9 is formed so that the MOS portion of the MOSFET is completed (FIG. 1(g)). The significant point of this producing method is in that the p-type base region 7 is not spread by thermal diffusion of impurity but is controlled by the range of ion injection. In this case, the range of ion injection is, for example, about 0.3 mm in the case of an acceleration voltage of 100 kV.

In another embodiment of the present invention shown in FIGS. 3(a) through 3(h), portions the same or equivalent to those in FIGS. 1(a) through 1(g) are correspondingly referenced. In this embodiment, as the substrate, a substrate in which a p-type SiC layer 11 is epitaxially grown on an n-type SiC substrate 10 is used (FIG. 3(a)), and an electrode layer 30 is formed on the p-type SiC layer 11 through an $SiO_2$ layer 2 in the same manner as in FIGS. 1(a) and 1(b) (FIGS. 3(b) and 3(c). Next, patterning of a gate electrode 3 is performed from the electrode layer 30. At this time, the gate electrode 3 is formed only on a region where an n-type channel is to be formed (FIG. 3(d)). Next, a photo-resist film 14 is formed so as to be connected to one side of the gate electrode 3 and n-type impurity ions 15 are injected by using the resist film 14 and the gate electrode 3 as masks. Then, the thus injected n-type impurity 16 is activated through heat treatment so that a part of the p-type epitaxial layer 11 is made to be an n-type region 12, so that the n-type region 12 constitutes an n-type base region together with the n-type substrate 10 (FIG. 3(e)). Further, in the same manner as in FIGS. 1(f) and 1(g), the n-type impurity is injected by using the gate electrode 3 as a part of the mask and then subjected to heat treatment to form an n+ source region 8 (FIG. 3(g)), and a source electrode 9 is formed (FIG. 3(h)), so that the MOS portion of the SiC MOSFET is completed. This embodiment utilizes such a point that activation of ion-injected n-type impurity is easily performed in comparison with that of the p-type impurity in the case of SiC.

According to the present invention, it is made possible to industrially produce SiC MOSFETs by employing a method of forming a predetermined conductivity type region by a selfalignment technique not by utilizing impurity diffusion which is impossible in the case of SiC but by utilizing only injection and activation of impurity ions.

What is claimed is:

1. A method of producing a silicon carbide MOSFET in which a second conductivity type base region is selectively formed in a surface layer of a first conductivity type semiconductor layer of silicon carbide, a first conductivity type base region is selectively formed in a surface layer of said second conductivity type base region, and a gate electrode is provided, through an insulating film, on a surface of said second conductivity type base region between said first conductivity type base region and an exposed portion of said first conductivity type semiconductor layer, said method comprising the steps of:

forming the gate electrode having an inclined surface at its end portion;

injecting impurity ions into a region of the first conductivity type semiconductor layer which is not covered with the gate electrode and into a region just under said inclined surface; and then forming the second conductivity type base region through heat treatment.

2. A method of producing a silicon carbide MOSFET in which a second conductivity type base region is selectively formed in a surface layer of a first conductivity type semiconductor layer of silicon carbide, a first conductivity type base region is selectively formed in a surface layer of said second conductivity type base region, and a gate electrode is provided, through an insulating film, on a surface of said second conductivity type base region between said first conductivity type base region and an exposed portion of said first conductivity type semiconductor layer, said method comprising the steps of:

epitaxially growing a second conductivity type silicon carbide layer on a first conductivity type silicon carbide substrate;

injecting impurity ions into said second conductivity type silicon carbide layer while leaving a portion of the second conductivity type base region; and forming a first conductivity type layer through heat treatment so as to extend to a portion of said first conductivity type substrate.

3. A method of producing a silicon carbide MOSFET according to claim 1 or 2, in which impurity ions are selectively injected from a surface of said second conductivity type base region, and said first conductivity type base region is formed through heat treatment.

4. A method of producing a silicon carbide MOSFET according to claim 1 or 2, in which said gate electrode is used as at least a part of a mask at the time of injection of impurity ions.

* * * * *